(12) United States Patent
Shibata et al.

(10) Patent No.: US 9,696,507 B2
(45) Date of Patent: Jul. 4, 2017

(54) OPTO-ELECTRIC HYBRID BOARD

(71) Applicant: NITTO DENKO CORPORATION, Ibaraki-shi, Osaka (JP)

(72) Inventors: Naoki Shibata, Ibaraki (JP); Yuichi Tsujita, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 15/031,962

(22) PCT Filed: Sep. 11, 2014

(86) PCT No.: PCT/JP2014/074028
§ 371 (c)(1),
(2) Date: Apr. 25, 2016

(87) PCT Pub. No.: WO2015/064226
PCT Pub. Date: May 7, 2015

(65) Prior Publication Data
US 2016/0266338 A1 Sep. 15, 2016

(30) Foreign Application Priority Data

Oct. 31, 2013 (JP) .................. 2013-227368

(51) Int. Cl.
G02B 6/42 (2006.01)
H05K 1/18 (2006.01)

(52) U.S. Cl.
CPC ............ G02B 6/4281 (2013.01); G02B 6/42 (2013.01); G02B 6/4214 (2013.01); H05K 1/189 (2013.01);
(Continued)

(58) Field of Classification Search
None
See application file for complete search history.

(56) References Cited

U.S. PATENT DOCUMENTS

2009/0310909 A1\* 12/2009 Ishii .................. G02B 6/43
385/14
2010/0316335 A1 12/2010 Furuyama
(Continued)

FOREIGN PATENT DOCUMENTS

| JP | 2010-113211 A | 5/2010 |
| JP | 2010-286777 A | 12/2010 |
| JP | 2012-194401 A | 10/2012 |

OTHER PUBLICATIONS

Notification of Transmittal of Translation of the International Preliminary Report on Patentability (Form PCT/IB/338) issued in counterpart International Application No. PCT/JP2014/074028 mailed May 12, 2016 with Forms PCT/IB/373 and PCT/ISA/237. (11 pages).

(Continued)

*Primary Examiner* — Hemang Sanghavi
(74) *Attorney, Agent, or Firm* — Westerman, Hattori, Daniels & Adrian, LLP

(57) ABSTRACT

An inventive opto-electric hybrid board includes: opto-electric module portions respectively defined on opposite end portions of an elongated insulation layer, and each including a first electric wiring of an electrically conductive pattern and an optical element provided on a front surface of the insulation layer; and an interconnection portion defined on a portion of the insulation layer extending from the opto-electric module portions, and including an optical waveguide optically coupled with the optical elements. A metal reinforcement layer provided on a back surface of the insulation layer as extending over the opto-electric module portions into the interconnection portion. A portion of the metal reinforcement layer present the interconnection por- (Continued)

tion has a smaller width than the opto-electric module portions, and the smaller width portion has rounded proximal corners.

12 Claims, 7 Drawing Sheets

(52) U.S. Cl.
CPC .. *G02B 6/4274* (2013.01); *H05K 2201/10121* (2013.01); *H05K 2201/10151* (2013.01)

(56) References Cited

U.S. PATENT DOCUMENTS

| | | | |
|---|---|---|---|
| 2011/0116737 A1* | 5/2011 | Kim | G02B 6/4201 385/14 |
| 2011/0222815 A1* | 9/2011 | Hamana | G02B 6/4214 385/14 |
| 2012/0237158 A1 | 9/2012 | Inoue et al. | |
| 2014/0064668 A1* | 3/2014 | Nishikawa | G02B 6/43 385/77 |

OTHER PUBLICATIONS

International Search Report dated Dec. 9, 2014, issued in counterpart International Application No. PCT/JP2014/074028 (in English) (1 page).

* cited by examiner

OPTO-ELECTRIC HYBRID BOARD

TECHNICAL FIELD

The present invention relates to an opto-electric hybrid board including an opto-electric module portion and an interconnection portion.

BACKGROUND ART

In recent electronic devices and the like, optical wirings are employed in addition to electric wirings to cope with increase in information transmission amount. With a trend toward size reduction of the electronic devices and the like, there is a demand for a wiring board which has a smaller size and a higher integration density so as to be mounted in a limited space. An opto-electric hybrid board as shown in FIG. 8A, for example, is proposed as such a wiring board, in which an opto-electric module portion E including an electric wiring 13 of an electrically conductive pattern and an optical element 10 mounted on pads 13a is provided on each (or one) of opposite end portions of a front surface of an insulation layer 12 such as of a polyimide, and an optical waveguide W including an under-cladding layer 20, a core 21 and an over-cladding layer 22 is provided on a back surface of the insulation layer 12 (see, for example, PTL 1).

In the opto-electric hybrid board, an optical signal transmitted through the core 21 of the optical waveguide W as indicated by a one-dot-and-dash line P in FIG. 8A is converted into an electric signal by the optical element 10 of the opto-electric module portion E for electrical control. Further, an electric signal transmitted through the electric wiring 13 is converted into an optical signal by the optical element 10. The optical signal is transmitted through the optical waveguide W to another opto-electric module portion (not shown) provided on an opposite side, and is taken out as an electric signal again.

In the opto-electric hybrid board, the insulation layer (such as of the polyimide) 12 contacts the optical waveguide W (such as made of an epoxy resin). Therefore, the optical waveguide W is liable to be stressed or slightly warped due to a difference in linear expansion coefficient between the insulation layer 12 and the optical waveguide W by an ambient temperature. Problematically, this increases the light transmission loss of the optical waveguide W. When the optical element for the optical-to-electric signal conversion and the electric-to-optical signal conversion and an IC for driving the optical element are to be mounted on the opto-electric module portion E, a mount surface of the opto-electric module portion E is liable to be unstable without provision of a reinforcement layer. Therefore, it will be impossible to properly mount the optical element and the IC on the opto-electric module portion E or, if possible, the opto-electric module portion E will fail to establish a reliable connection.

To cope with this, it is proposed to provide a metal reinforcement layer 11 such as of stainless steel on the back surface of the insulation layer 12 to impart the opto-electric module portion E with a certain level of rigidity, whereby the stress and the slight warpage of the optical waveguide W are prevented to suppress the increase in light transmission loss. Without provision of the metal reinforcement layer 11 in an interconnection portion of the opto-electric hybrid board other than the opto-electric module portion E, it is possible to ensure the flexibility of the optical waveguide W, so that the opto-electric hybrid board can be mounted in a smaller space to establish optical and electrical connections in a complicated positional relationship.

RELATED ART DOCUMENT

Patent Document

PTL1: JP-A-2012-194401

SUMMARY OF INVENTION

In an opto-electric hybrid board in which opto-electric module portions E, E' each reinforced with a metal reinforcement layer 11 are connected to an interconnection portion B including a flexible optical waveguide W, as schematically shown in FIG. 8B, the optical waveguide W (indicated by rough hatching) extends from portions of the opto-electric hybrid board each provided with the metal reinforcement layer 11 (regions indicated by fine hatching) to a portion of the opto-electric hybrid board not provided with the metal reinforcement layer 11. Therefore, the optical waveguide W is liable to be stretched and twisted by the highly rigid metal reinforcement layers 11 at boundaries X, X' between the opto-electric module portions and the interconnection portion whenever the optical waveguide W is moved. Thus, the optical waveguide W is liable to be broken or folded at the boundaries.

It is recently proposed to reduce the width of an interconnection portion B as shown in FIG. 8C in order to increase the flexibility of an opto-electric hybrid board. Further, it is contemplated that metal reinforcement layers 11 are configured such as to partly project into the interconnection portion in order to increase the strength of boundaries between the opto-electric module portions E, E' and the interconnection portion B. Even if the metal reinforcement layers each have this configuration, the optical waveguide W is liable to be torn or folded along boundaries Y, Y' between metal reinforcement layer present regions and a metal reinforcement layer absent region as in the aforementioned case. In addition, the optical waveguide W is liable to be stressed or damaged at width reduction corners Z, Z' by the warpage and the twisting of the metal reinforcement layers 11.

Therefore, it is strongly desirable to configure the flexible opto-electric hybrid board so that the optical waveguide W is not badly stressed at the boundaries between the metal reinforcement layer present regions and the metal reinforcement layer absent region.

In view of the foregoing, it is an object of the present invention to provide an excellent opto-electric hybrid board which includes a sufficiently flexible interconnection portion including an optical waveguide protected from bending and twisting of the interconnection portion and is substantially free from increase in light transmission loss.

According to a first inventive aspect to achieve the aforementioned object, there is provided an opto-electric hybrid board, which includes: an elongated insulation layer; an opto-electric module portion defined on at least one end portion of the insulation layer; an interconnection portion defined on a portion of the insulation layer extending from the opto-electric module portion; and a metal reinforcement layer provided on a back surface of the insulation layer as extending over the opto-electric module portion into a portion of the interconnection portion; wherein a first electric wiring of an electrically conductive pattern and an optical element are provided on a front side of the opto-electric module portion, wherein an elongated optical waveguide is provided on a back side of the interconnection portion and optically coupled with the optical element provided on the opto-electric module portion, and wherein a portion of the metal reinforcement layer present in the interconnection portion has a smaller width than a greater width portion of the metal reinforcement layer present in the opto-electric module portion, and a boundary between the smaller width portion and the greater width portion of the metal reinforcement layer is rounded so as to include a rounded proximal corner.

According to a second inventive aspect, a second electric wiring is further provided in the interconnection portion in the opto-electric hybrid board. According to a third inventive aspect, the rounded proximal corner has a curvature radius R of 0.3 to 5 mm in the opto-electric hybrid board.

According to a fourth inventive aspect, the metal reinforcement layer is configured such as to extend longitudinally partway of the interconnection portion, and a distal end port ion of the metal reinforcement layer in the interconnection port ion is rounded so as to include a rounded distal corner in the opto-electric hybrid board according to any one of the first to third inventive aspects. According to a fifth inventive aspect, the rounded distal corner has a curvature radius R' of 0.1 to 5 mm in the opto-electric hybrid board.

According to a sixth inventive aspect, a portion of the metal reinforcement layer extends along the entire length of the interconnection portion in the opto-electric hybrid board according to any one of the first to third inventive aspects.

In the present invention, the term "width" refers to a dimension measured in a transverse direction perpendicular to a longitudinal direction of the opto-electric hybrid board including the elongated insulation layer as a base, as viewed in plan.

In the inventive opto-electric hybrid board, the metal reinforcement layer is provided on the back surface of the insulation layer (serving as the base) as extending over the opto-electric module portion into the interconnection portion. The portion of the metal reinforcement layer present in the interconnection portion has a smaller width, and the proximal corner between the smaller width portion and the greater width portion is rounded (or has an arcuate contour). With this configuration, the smaller width portion of the metal reinforcement layer has the rounded proximal corner and, therefore, even if the interconnection portion is bent or twisted, the interconnection portion is less liable to be stretched by the opto-electric module portion imparted with higher rigidity by the provision of the metal reinforcement layer. Thus, a stress exerted on the rounded portion is distributed along the rounded portion to be alleviated without concentrating on a flexible portion of the interconnection portion. Therefore, the interconnection portion is maintained intact during prolonged use without a certain portion thereof being torn, badly folded or broken. Since the interconnection portion is not locally stressed, a core of the optical waveguide provided along the interconnection portion is free from the slight warpage and the like, thereby suppressing the increase in the light transmission loss of the optical waveguide.

Particularly, where the second electric wiring is further provided in the interconnection portion in the present invention, a greater amount of information can be transmitted in the form of optical signals as well as in the form of electric signals and, therefore, this arrangement is advantageous. Where the rounded proximal corner has a curvature radius R of 0.3 to 5 mm, the stress exerted on this portion can be more effectively and advantageously distributed along this portion.

Particularly, where the metal reinforcement layer extends longitudinally partway of into the interconnection portion and the distal end of the metal reinforcement layer has the rounded distal corner in the present invention, a portion of the elongated interconnection portion extending partway can be reinforced with the metal reinforcement layer. Further, a stress is distributed along the rounded distal corner without concentrating on the rounded distal corner. This more advantageously suppresses the adverse influence on the interconnect ion portion and the optical waveguide.

Where the rounded distal corner has a curvature radius R' of 0.1 to 5 mm, the stress exerted on this portion can be more effectively and advantageously distributed along this portion.

Where the portion of the metal reinforcement layer reinforcing the interconnection portion extends along the entire length of the interconnection portion in the present invention, the interconnection portion can be longitudinally entirely reinforced with the metal reinforcement layer. This arrangement is advantageous because the interconnection portion is flexible and less liable to be folded or twisted.

DESCRIPTION OF EMBODIMENT

Figure 1A:
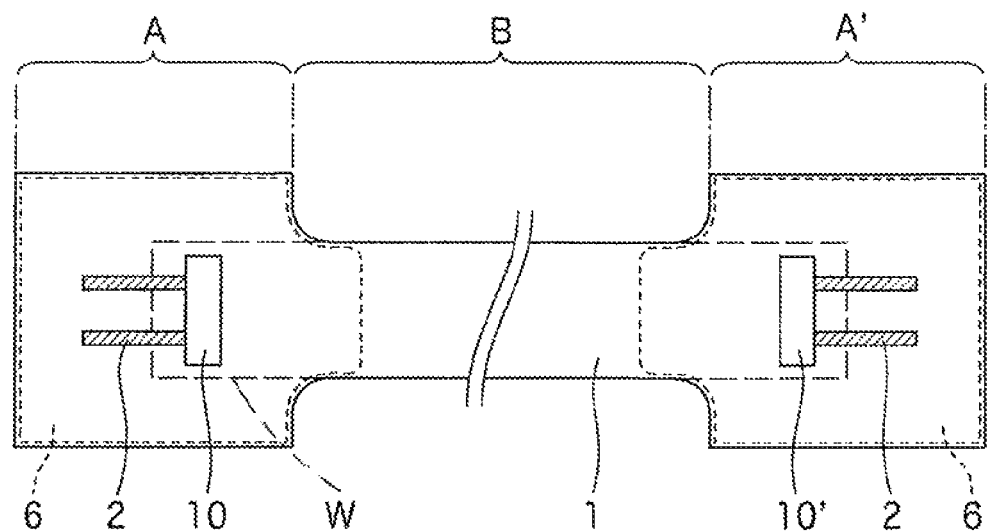
FIG. 1A is a schematic plan view illustrating an opto-electric hybrid board according to one embodiment of the present invention.
Figure 1B:
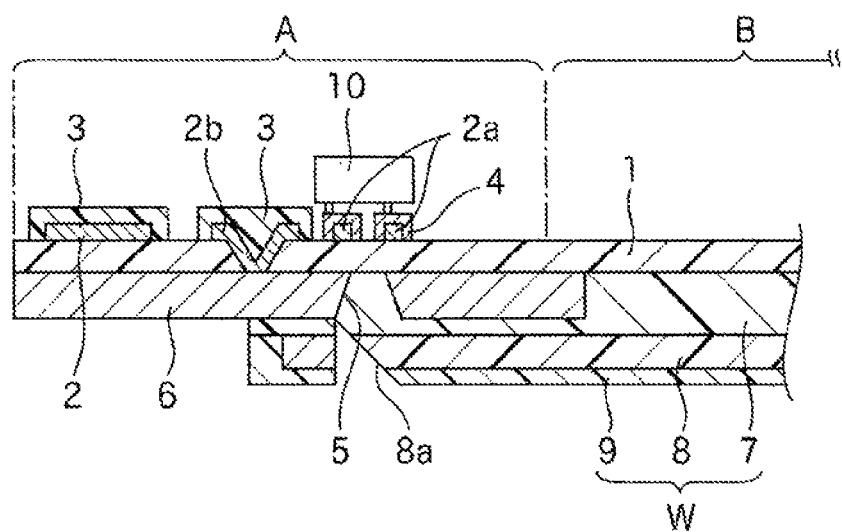
FIG. 1B is an explanatory diagram schematically illustrating a major portion of the opto-electric hybrid board in section on an enlarged scale.

An embodiment of the present invention will hereinafter be described in detail based on the drawings, FIG. 1A is a plan view schematically illustrating an opto-electric hybrid board according to one embodiment of the present invention, and FIG. 1B is an explanatory diagram schematically illustrating a major portion of the opto-electric hybrid board in section on an enlarged scale.

The opto-electric hybrid board includes a pair of left and right opto-electric module portions A, A' each having a generally square plan shape and an interconnection portion B provided between the opto-electric module portions A, A' and having an elongated shape as a whole. In the present invention, a component extending longitudinally is regarded as having an elongated shape even if it has a widthwise projection. More specifically, a unitary elongated insulation layer (in this embodiment, a transparent polyimide layer) 1 is employed as a base, and the opto-electric module portions A, A' are respectively provided on front surfaces of left and right wider end portions of the insulation layer 1 and each include an optical element 10, 10' and a first electric wiring 2 of an electrically conductive pattern. In this embodiment, the optical element 10 of the opto-electric module portion A serves as a light receiving element which receives an optical signal and converts the optical signal to an electric signal. The optical element 10' of the opto-electric module portion A' serves as a light emitting element which receives an electric signal and converts the electric signal to an optical signal.

An optical waveguide W is provided on a back side of a smaller width portion of the insulation layer 1 between the left and right opto-electric module portions A and A', and this portion serves as the interconnection portion B for transmit ting optical signals. The opto-electric module portions A, A' may each further include an IC, an active element and the like for driving the optical element 10, 10' as required. In this embodiment, illustration and description of these elements will be omitted. The opto-electric module portions A, A' may each further include a connector for connection to another electric circuit board or the like. Since the opto-electric module portions A, A' basically have symmetrical structures, only the opto-electric module portion A will be described and the description of the opto-electric module portion A' will hereinafter be omitted.

In the opto-electric module portion A, the first electric wiring 2 is provided as having the predetermined electrically conductive pattern, which includes pads 2a for mounting the optical element 10 and ground electrodes 2b. The pads 2a each have a surface coated with a gold plating layer 4 for increasing the electrical conductivity thereof. A portion of the first electric wiring 2 other than the pads 2a is covered with a cover lay 3 to be protected for insulation (in FIG. 1A, the cover lay 3 is not shown).

A metal reinforcement layer (in this embodiment, a stainless steel layer) 6 is provided on the back surface of the insulation layer 1 as extending over the opto-electric module portion A into the interconnection portion B so as to stably maintain the planarity of this portion. A reference numeral 5 designates through-holes through which the optical element 10 is optically coupled with the optical waveguide W.

Figure 2:
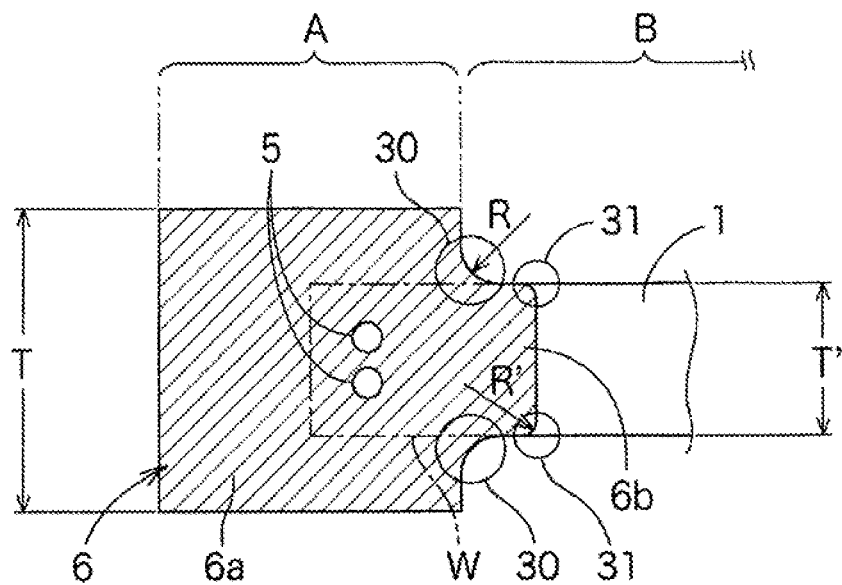
FIG. 2 is a schematic diagram for explaining the shape of a metal reinforcement layer in the embodiment described above.

The metal reinforcement layer 6 will be described in greater detail. As shown in FIG. 2 which is a diagram of the opto-electric module portion A of the opto-electric hybrid board seen from the back side, the metal reinforcement layer 6 includes a greater width portion 6a having an outer shape generally conformal to the outer shape of the opto-electric module portion A, and a smaller width portion 6b extending from one end of the greater width portion 6a into the interconnection portion B and having a smaller width like the width of the interconnection portion B. The reference numeral 5 designates the through-holes for the optical coupling (see FIG. 1B). The optical waveguide W is provided below the metal reinforcement layer 6 though not shown (only the contour of the optical waveguide W is shown by a one-dot-and-dash line).

The smaller width portion 6b has rounded proximal corners 30. The smaller width portion 6b extends partway of into the interconnection portion B, and has rounded distal corners 31. With the provision of the rounded portions, stresses exerted on the rounded proximal corners 30 and the rounded distal corners 31 are distributed along the rounded proximal corners 30 and the rounded distal corners 31 to be alleviated without concentrating on a flexible portion of the interconnection portion B, even if the interconnection portion B is bent or twisted to be stretched by the opto-electric module portion A imparted with higher rigidity by the metal reinforcement layer 6. Therefore, the interconnection portion B is maintained intact during prolonged use without being partly torn, badly folded or broken. This is a major feature of the present invention.

On the back side of the insulation layer 1 (referring back to FIG. 1B), on the other hand, the optical waveguide W extends from the interconnection portion B, and an end portion of the optical waveguide W is optically coupled with the optical element 10 provided on the front side of the insulation layer 1 via the through-holes 5 of the metal reinforcement layer 6. More specifically, the optical waveguide W includes an under-cladding layer 7, a core 8 including a plurality of core portions arranged parallel to each other below the under-cladding layer 7, and an over-cladding layer 9 covering the core 8. The under-cladding layer 7, the core 8 and the over-cladding layer 9 are provided in this order downward from the back surface of the insulation layer 1. The under-cladding layer 7 partly enters the through-holes 5 and is in contact with the metal reinforcement layer 6.

Therefore, the opto-electric hybrid board is freely bendable with excellent flexibility. In addition, even if the opto-electric module portion A, A' and the interconnection portion B are brought into a significantly bent positional relationship to be stretched or twisted, the stresses occurring due to the stretching or the twisting can be uniformly distributed along the rounded portions (the rounded proximal corners 30 and the rounded distal corners 31 of the smaller width portion 6b) of the metal reinforcement layer 6 connected to the interconnection portion B to be thereby alleviated. Therefore, as previously described, the interconnection portion B is maintained intact during prolonged use without any damage and breakage thereof. Since the interconnection portion B is not locally stressed, the core 8 of the optical waveguide W provided along the interconnection portion B is free from the slight warpage or the like, thereby suppressing the increase in the light transmission loss of the optical waveguide W.

The opto-electric hybrid board may be produced, for example, in the following manner.

Figure 3A:
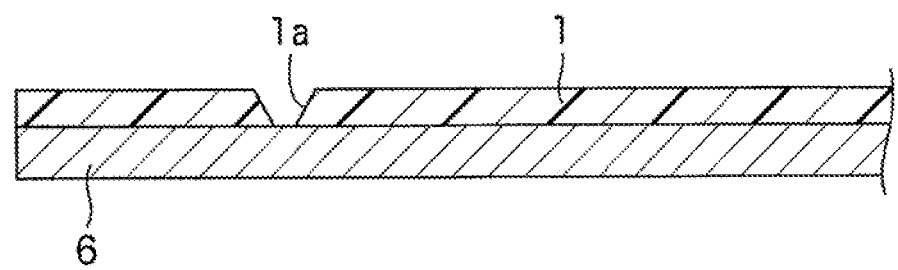
FIGS. 3A and 3B are schematic diagrams for explaining an opto-electric module portion fabricating step in a production method for the opto-electric hybrid board.

First, as shown in FIG. 3A, a flat elongated metal reinforcement layer 6 is prepared. Exemplary materials for the metal reinforcement layer 6 include stainless steel, copper, silver, aluminum, nickel, chromium, titanium, platinum and gold, among which stainless steel is preferred for strength and bendability. The metal reinforcement layer 6 preferably has a thickness in a range of 10 to 70 μm. If the metal reinforcement layer 6 is excessively thin, it will be impossible to sufficiently provide the opto-electric hybrid board reinforcing effect. If the metal reinforcement layer 6 is excessively thick, on the other hand, the metal reinforcement layer is liable to have an excessively high rigidity. Therefore, the opto-electric hybrid board is liable to have poorer bendability, greater bulkiness, and poorer handleability with an excessively great overall thickness.

Then, a photosensitive insulative resin such as a resin containing a polyimide resin is applied onto a surface of the metal reinforcement layer 6, and formed into an insulation layer 1 of a predetermined pattern by a photolithography process. In this embodiment, holes 1a through which the surface of the metal reinforcement layer 6 is partly exposed are formed at predetermined positions in the insulation layer 1 for formation of ground electrodes 2b in contact with the metal reinforcement layer 6. The insulation layer 1 preferably has a thickness in a range of 3 to 50 μm.

Figure 3B:
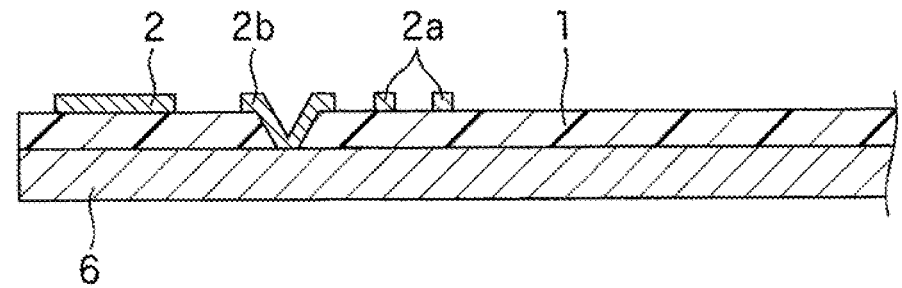

In turn, as shown in FIG. 3B, a first electric wiring 2 (including pads 2a for mounting an optical element 10, and the ground electrodes 2b) for an opto-electric module portion A is simultaneously formed, for example, by a semi-additive method. In this method, a metal film (not shown) such as of copper is formed on a surface of the insulation layer 1 by sputtering or electroless plating. The metal film serves as a seed layer (a base layer for formation of an electro-plating layer) in the subsequent electro-plating step. Subsequently, a photosensitive resist (not shown) is applied to both surfaces of a stack including the metal reinforcement layer 6, the insulation layer 1 and the seed layer, and then holes for an electrically conductive pattern of the first electric wiring 2 are formed in a photosensitive resist layer present on the seed layer by a photolithography process. Thus, surface portions of the seed layer are exposed in bottoms of the holes.

In turn, an electro-plating layer of an electrically conductive material such as copper is formed on the surface portions of the seed layer exposed in the bottoms of the holes by electro-plating. Then, the photosensitive resist is lifted off with a sodium hydroxide aqueous solution. Thereafter, a portion of the seed layer not formed with the electro-plating layer is removed by soft etching. Remaining portions of a stack of the seed layer and the electro-plating layer serve as the first electric wiring 2. Preferred examples of the electrically conductive material include highly electrically conductive and highly ductile metal materials such as chromium, aluminum, gold and tantalum in addition to copper. Other preferred examples of the electrically conductive material include alloys containing at least one of these metals. The first electric wiring 2 preferably has a thickness in a range of 3 to 30 μm. If the thickness of the electric wiring is smaller than the aforementioned range, the electric wiring is liable to have poorer characteristic properties. If the thickness of the electric wiring is greater than the aforementioned range, on the other hand, the opto-electric module portion A is liable to have an excessively great overall thickness including the thickness of the metal reinforcement layer 6 provided on the back side and, hence, have greater bulkiness.

Figure 4A:
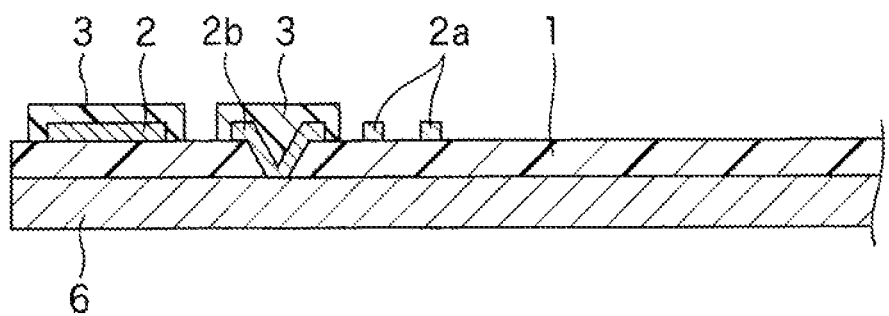
FIGS. 4A to 4C are schematic diagrams for explaining the opto-electric module portion fabricating step in the opto-electric hybrid board production method.

Subsequently, as shown in FIG. 4A, an electroless plating layer (not shown) such as of nickel is formed on a surface of the first electric wiring 2 for the opto-electric module portion A, and then a photosensitive insulative resin such as a resin containing a polyimide resin is applied and patterned by a photolithography process to form a cover lay 3 on a portion of the first electric wiring 2 other than the optical element mounting pads 2a. The cover lay 3 preferably has a thickness in a range of 1 to 20 μm. Where the thickness of the cover lay 3 fails within this range, the cover lay 3 can effectively protect and reinforce the first electric wiring 2.

Figure 4B:
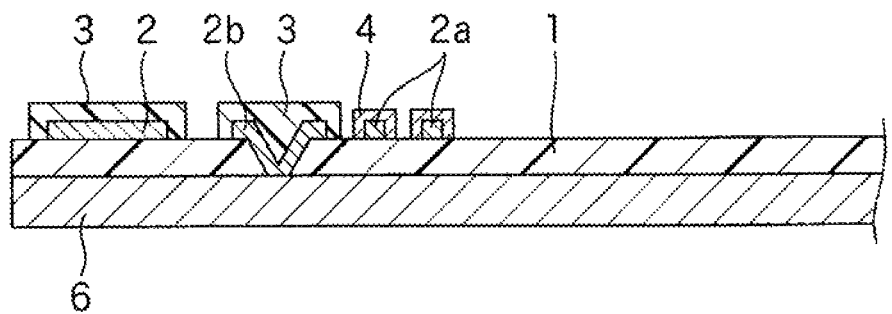

In turn, as shown in FIG. 4B, parts of the electroless plating layer (not shown) present on the pads 2a of the first electric wiring 2 are removed by etching, and then an electro-plating layer such as of gold or nickel (in this embodiment, a gold-plating layer) 4 is formed on the pads 2a from which the electroless plating layer has been removed.

Subsequently, a photosensitive resist (not shown) is applied to both surfaces of a stack of the metal reinforcement layer 6 and the insulation layer 1, and then holes are formed in a photosensitive resist layer present on the back surface of the metal reinforcement layer 6 (opposite from that formed with the first electric wiring 2) as corresponding to parts of the metal reinforcement layer 6 to be removed (for an interconnection portion B and light path through-holes) by a photolithography process, so that parts of the back surface of the metal reinforcement layer 6 are exposed in the holes.

Figure 4C:
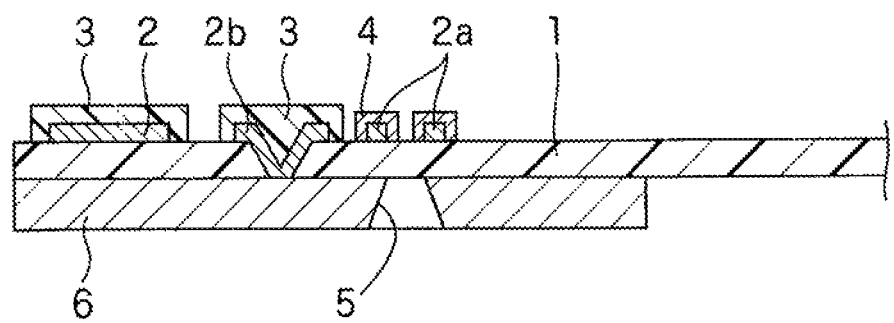

Then, as shown in FIG. 4C, the parts of the metal reinforcement layer 6 exposed in the holes are removed by etching with the use of an etching aqueous solution suitable for the material for the metal reinforcement layer 6 (with the use of a ferric chloride aqueous solution, for example, where the metal reinforcement layer 6 is a stainless steel layer), whereby the insulation layer 1 is exposed from the removed parts, Thereafter, the photosensitive resist is lifted off with the use of a sodium hydroxide aqueous solution. Thus, the metal reinforcement layer 6 is configured to have two left and right, portions which respectively extend from the opto-electric module portions A, A' to opposite end portions of the interconnection portion B on the back side of the opto-electric module portions A, A' as shown in FIGS. 1A and 1B.

Figure 5A:
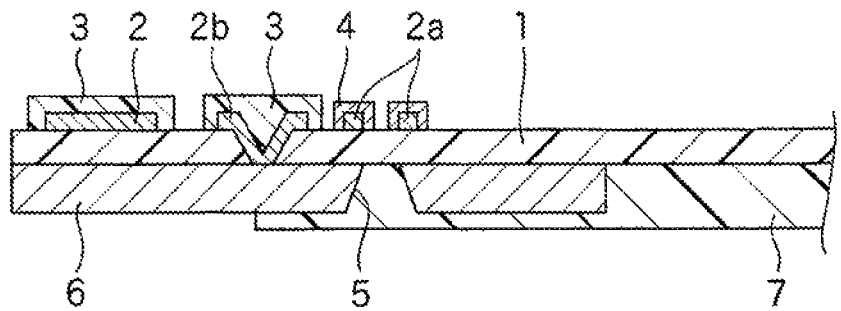
FIGS. 5A to 5D are schematic diagrams for explaining an interconnection portion fabricating step in the opto-electric hybrid board production method.

Subsequently, an optical waveguide W (see FIG. 1B) is fabricated on the back surfaces of the insulation layer 1 and the metal reinforcement layer 6. More specifically, as shown in FIG. 5A, a photosensitive resin as a material for an under-cladding layer 7 is first applied on the back surfaces (lower surfaces in FIG. 5A) of the insulation layer 1 and the metal reinforcement layer 6, and then the resulting layer is cured by exposure to radiation. Thus, the under-cladding layer 7 is formed. The under-cladding layer 7 preferably has a thickness in a range of 3 to 50 μm (as measured from the back surface of the metal reinforcement layer 6). The under-cladding layer 7 may be patterned in a predetermined pattern by a photolithography process.

Figure 5B:
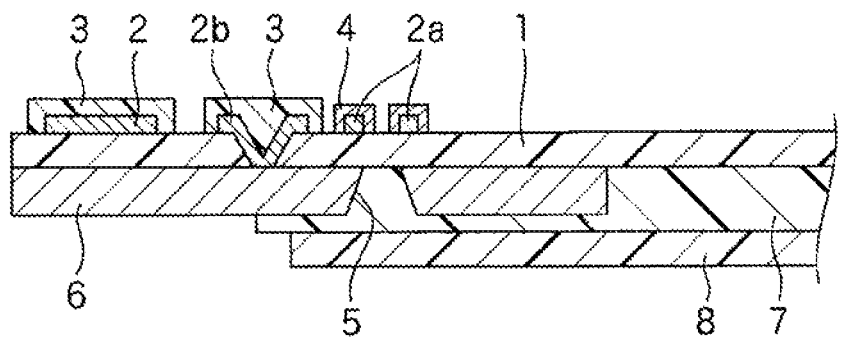

Then, as shown in FIG. 5B, a core 8 is formed in a predetermined pattern on a surface (a lower surface in FIG. 5B) of the under-cladding layer 7 by a photolithography process. The core 8 preferably has a thickness in a range of 20 to 100 μm. The core 8 preferably has a width in a range of 10 to 100 μm. An exemplary material for the core 8 is the same type of photosensitive resin as the under-cladding layer 7, but has a higher refractive index than the materials for the under-cladding layer 7 and an over-cladding layer 9 to be described later (see FIG. 5C). The refractive index may be controlled in consideration of the selection of the types of the materials and the formulations of the materials for the under-cladding layer 7, the core 8 and the over-cladding layer 9.

Figure 5C:
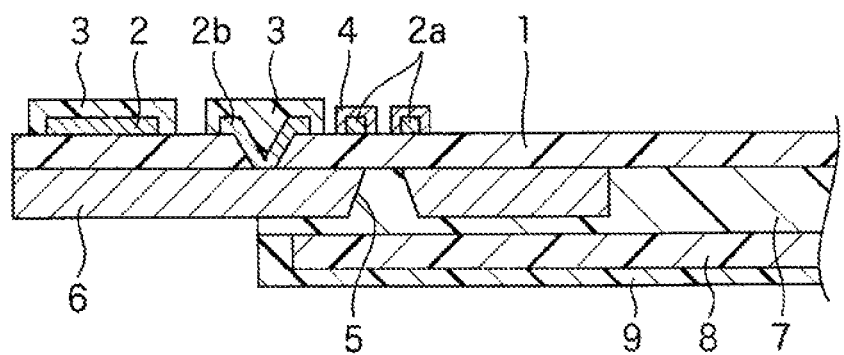

Subsequently, as shown in FIG. 5C, the over-cladding layer 9 is formed over a surface (a lower surface in FIG. 5C) of the under-cladding layer 7 by a photolithography process to cover the core 8. The over-cladding layer 9 has a greater thickness than the core 8, i.e., preferably has a thickness of not greater than 300 μm (as measured from the surface of the under-cladding layer 7). An exemplary material for the over-cladding layer 9 is the same type of photosensitive resin as the under-cladding layer 7. For the formation of the over-cladding layer 9, the photosensitive resin may be patterned into a predetermined pattern by a photolithography process.

Figure 5D:
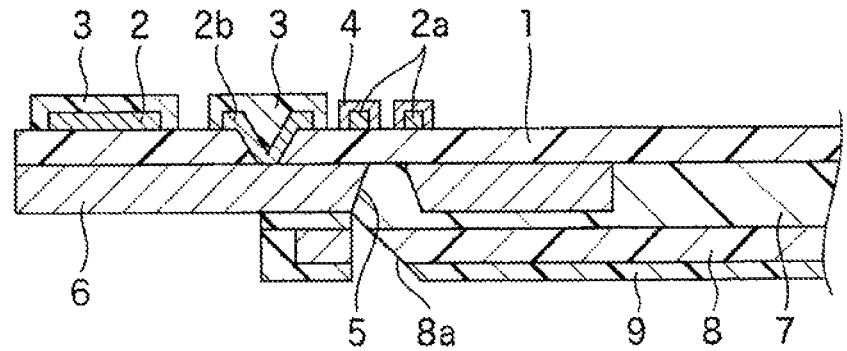

Then, as shown in FIG. 5D, a light reflecting surface 8a inclined at 45 degrees with respect to a longitudinal axis of the core 2 is formed in a portion of the optical waveguide W (each end portion of the optical waveguide W as seen in FIG. 1B) corresponding to the pads 2a provided on the front surface of the insulation layer 1 by a laser processing method, a cutting method or the like. Then, an optical element 10 is mounted on the pads 2a. Thus, an intended opto-electric hybrid board is provided.

In the production method described above, the pads 2a of the first electric wiring 2 for mounting the optical element 10 are covered with the gold plating layer 4, but the coverage with the plating layer is not necessarily required depending on the material for the first electric wiring 2 and the required characteristic properties of the first electric wiring 2.

In the embodiment described above, the opto-electric module portions A, A' are provided integrally on left and right sides of the interconnection portion B. However, it is not necessarily required to provide the left and right opto-electric module portions A, A' in pair, but only one of the opto-electric module portions may be provided. In this case, a distal end of the interconnection portion B may be connected to another opto-electric module portion via a connector or the like.

In the embodiment described above, the rounded proximal corners 30 of the smaller width portion 6b (see FIG. 2) of the metal reinforcement layer 6 preferably each have a curvature radius R of 0.3 to 5 mm, particularly preferably 0.5 to 5 mm. Where the curvature radius R of the rounded proximal corners 30 falls within this range, a stress exerted on the rounded proximal corners can be particularly effectively distributed along the rounded proximal corners and, therefore, the interconnection portion B can be maintained intact. Similarly, the rounded distal corners 31 of the smaller width portion 6b preferably each have a curvature radius R' of 0.1 to 5 mm, particularly preferably 0.3 to 5 mm.

Only the proximal corners 30 may be rounded. That is, the distal corners 31 are not necessarily required to be rounded. The rounded proximal corners 30 can provide the intended effect to uniformly distribute the stress exerted on the interconnection portion B to some extent.

In the embodiment described above, the ratio (T:T') of the width (T in FIG. 2) of the greater width portion 6a to the width (T' in FIG. 2) of the smaller width portion 6b of the metal reinforcement layer 6 is preferably about 1:0.98 to about 1:0.05. If a difference between the width of the greater width portion 6a and the width of the smaller width portion 6b is small, the interconnection portion B is liable to have insufficient flexibility. If the smaller width portion 6b has an excessively small width, on the other hand, the interconnection portion B is liable to have insufficient strength.

Figure 6A:
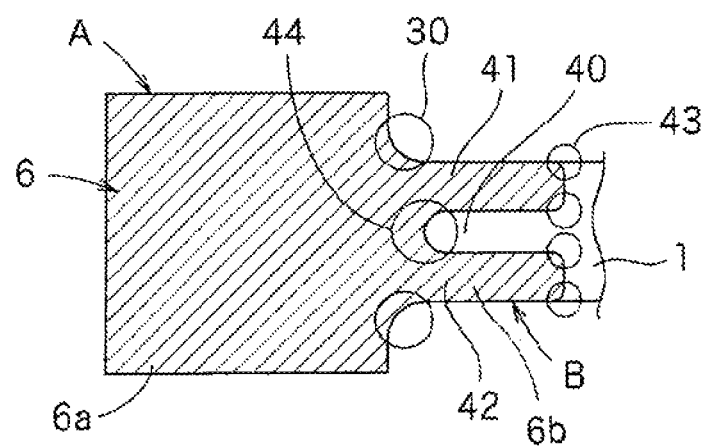
FIGS. 6A to 6C are explanatory diagrams showing modifications of the metal reinforcement layer as seen in plan.

The shape of the metal reinforcement layer 6 is not limited to that of the aforementioned embodiment, but the metal reinforcement layer 6 may have different-patterns. For example, as shown in FIG. 6A, the smaller width port ion 6b may be configured such as to include two elongated portions 41, 42 extending longitudinally and a slit 40 provided between the two elongated portions 41, 42 (the through-holes 5 for the optical coupling are not shown in FIG. 6A and so on). In this case, the elongated portions 41, 42 preferably each have rounded distal corners 43, and the slit 40 preferably has a rounded proximal corner 44. This configuration imparts the interconnection portion B with higher flexibility than that shown in FIG. 2 without reduction in reinforcement effect.

Figure 6B:
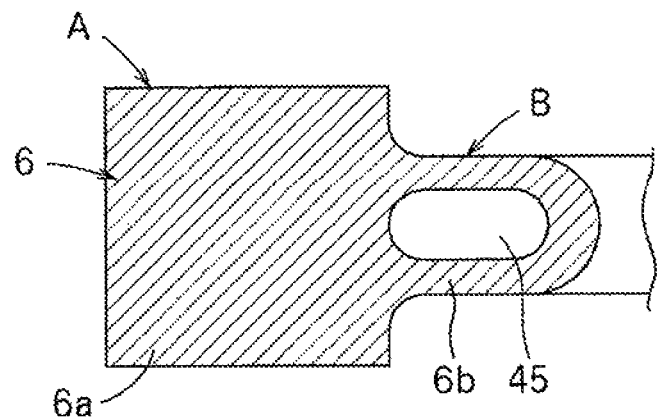

Further, as shown in FIG. 6B, the smaller width portion 6b of the metal reinforcement layer 6 may be configured such as to have an elongated oval slit 45 extending longitudinally. This configuration imparts the interconnection portion B with higher flexibility while providing the interconnection portion reinforcing effect.

Figure 6C:
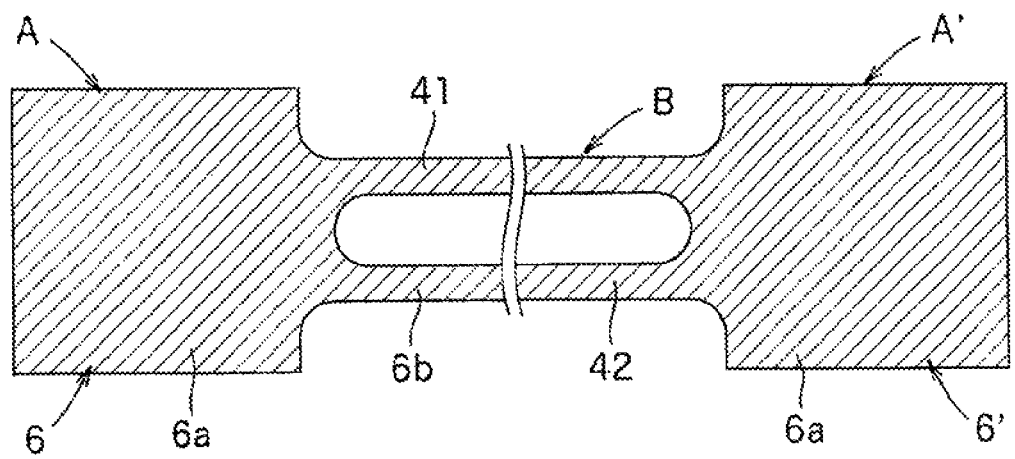

As shown in FIG. 6C, the smaller width portion 6b may be configured such that the two elongated portions 41, 42 shown in FIG. 6A extend along the entire length of the interconnection portion B to the opposite opto-electric module portion A'. With this configuration, the interconnection portion B is imparted with flexibility, and is less liable to be irregularly twisted. Therefore, the opto-electric hybrid board can be advantageously mounted in a smaller space.

Figure 7A:
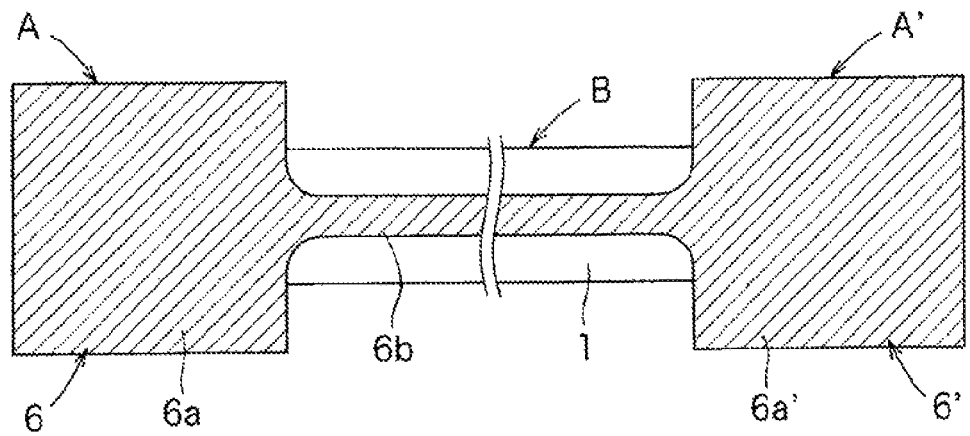
FIGS. 7A to 7C are explanatory diagrams showing other modifications of the metal reinforcement-layer as seen in plan.

As shown in FIG. 7A, the smaller width portion 6b may be configured such as to have a very small width and extend a long the entire length of the interconnection portion B to the opposite opto-electric module portion A'. This configuration imparts the interconnection portion B with higher flexibility and, therefore, is advantageously employed for an application in which the interconnection portion B is required to be relatively freely bendable in various directions.

Figure 7B:
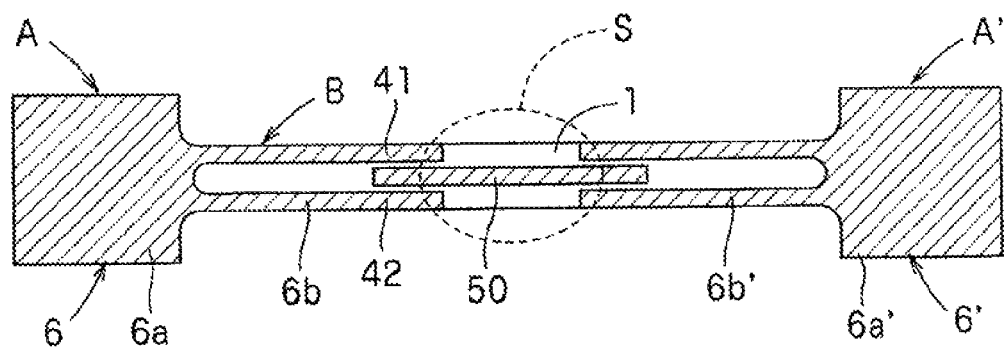

Further, as shown in FIG. 7B, the smaller width portion 6b may be configured such as to include two elongated portions 41, 42 extending longitudinally on the interconnection portion B and an auxiliary elongated portion 50 extending longitudinally in a middle portion of the interconnection portion B. The auxiliary elongated portion 50 overlaps two left elongated portions 41, 42 and two right elongated portions 41, 42, whereby the interconnection portion B is easily bendable in a region S enclosed by a broken line in FIG. 7B and is less liable to be folded. Therefore, the opto-electric hybrid board is advantageously mounted in a smaller space.

Figure 7C:
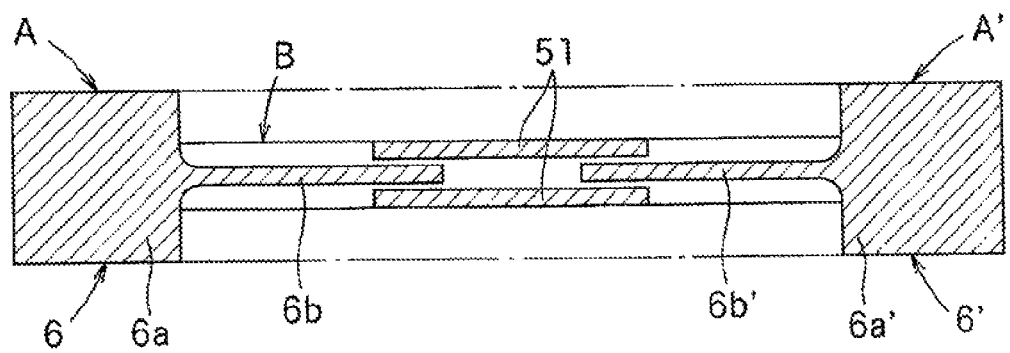

In contrast to the aforementioned configuration, as shown in FIG. 7C, the smaller width portion 6b may be configured such as to include a single smaller width portion extending partway of into the interconnection portion B and two auxiliary elongated portions 51 provided in a middle portion of the interconnection portion B as respectively extending longitudinally along opposite edges of the interconnection portion B. Thus, opposite left and right end portions of the interconnection portion B are easily bendable and less liable to be folded.

In the aforementioned embodiments, the opto-electric hybrid board is configured such that the interconnection portion B provided between the left and right opto-electric module portions A, A' has a smaller width than the opto-electric module portions A, A', and the metal reinforcement layer 6 is configured according to this configuration to include the greater width portions 6a respectively provided on the back side of the left and right opto-electric module portions A, A' and the smaller width portion 6b provided on the back side of the narrower interconnection portion B. Alternatively, as indicated by a one-dot-and-dash line in FIG. 7C, the opto-electric hybrid board may entirely have an elongated shape having a constant width, and only a portion of the metal reinforcement layer 6 present on the back side of the interconnection portion B may serve as the smaller width portion 6b. In this case, it is possible to provide the same effects as in the aforementioned embodiments.

In the aforementioned embodiments, the interconnection portion B is configured to include only the optical waveguide W, but may be configured to further include a second electric wiring.

Next, an inventive example will be described in conjunction with a comparative example. It is noted that the invention be not limited to the following inventive example.

EXAMPLES

Example 1

The opto-electric hybrid board shown in FIGS. 1A and 1B was produced in the aforementioned manner. The interconnection portion B had a length of 20 cm. A 20-μm thick stainless steel layer was provided as the metal reinforcement layer. The rounded proximal corners of the smaller width portion of the metal reinforcement layer each had a curvature radius R of 1.5 mm, and the rounded distal corners of the smaller width portion projecting to the interconnection portion each had a curvature radius R' of 0.8 mm. The ratio (T:T') between the thickness T of the greater width portion and the thickness T' of the smaller width portion was 1:0.3. The insulation layer had a thickness of 5 μm, and the under-cladding layer had a thickness of 10 μm (as measured from the back surface of the insulation layer). The core had a thickness of 50 μm and a width of 50 μm. The over-cladding layer had a thickness of 70 μm (as measured from the surface of the under-cladding layer). The first electric wiring had a thickness of 5 μm.

Comparative Example 1

Figure 8A:
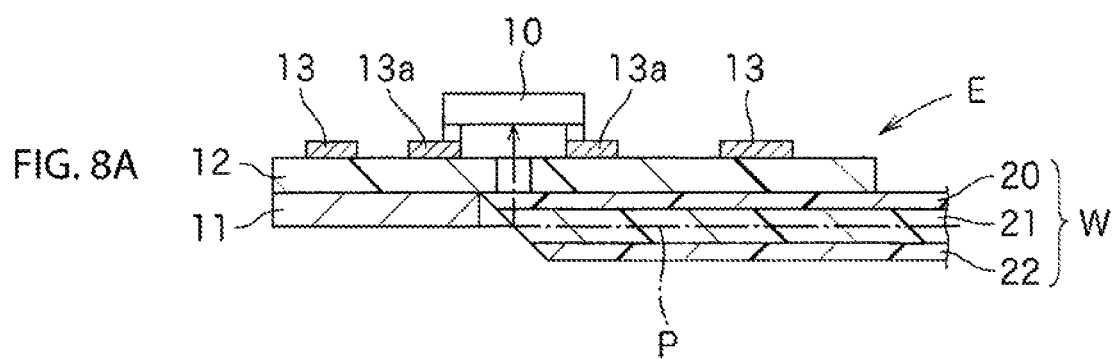
FIG. 8A is a longitudinal sectional view schematically illustrating an exemplary conventional opto-electric hybrid board.
Figure 8B:
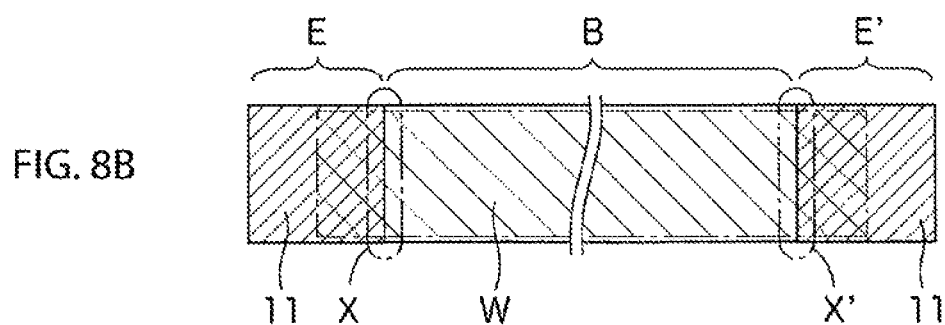
FIG. 8B is a schematic plan view for explaining a problem associated with the prior-art opto-electric hybrid board.
Figure 8C:
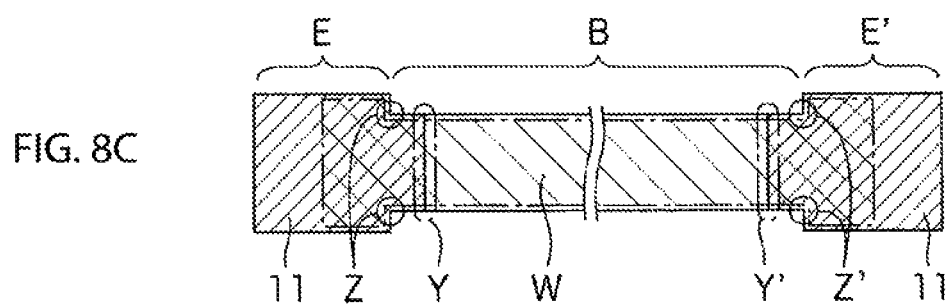
FIG. 8C is a schematic plan view for explaining a problem associated with another conventional opto-electric hybrid board having a different configuration.

An opto-electric hybrid board was produced in substantially the same manner as in Example 1, except that the metal reinforcement layer was configured at shown in FIG. 8B without the provision of the rounded portions.

[Measurement of Light Input Loss]

The same types of light emitting element and light receiving element as those used in Example 1 and Comparative Example 1 were prepared. The light emitting element, was ULM850-10-TT-C0104U available from ULM Photonics GmbH, and the light receiving element was PDCA04-70-GS available from Albis Optoelectronics AG. The amount $I_o$ of light emitted from the light emitting element and directly received by the light, receiving element was measured. Then, the opto-electric hybrid boards of Example 1 and Comparative Example 1 were each twisted widthwise once and, in this state, laterally stretched with a force of 0.5 N and fixed. Light emitted from the light emitting element provided in the opto-electric module portion A' was received by the light receiving element provided in the opto-electric module portion A via the core of the optical waveguide W. The amount I of the light thus received was measured. Then, a light input loss ($-10 \times \log(I/I_o)$) was calculated based on these values. As a result, the light input loss of the opto-electric hybrid board of Example 1 was 2.3 dB. In contrast, the light input loss of the opto-electric hybrid board of Comparative Example 1 was 2.8 dB. The light input loss was suppressed in the opto-electric hybrid board of Example 1.

[Breaking Strength]

As in the measurement of the light input loss, the opto-electric hybrid boards of Example 1 and Comparative Example 1 were each twisted widthwise once and, in this state, laterally stretched. Then, the stretching load was increased, and a stretching load (breaking strength) was measured when the interconnection portion B was broken. As a result, the opto-electric hybrid board of Example 1 had a breaking strength of 12 N, and the opto-electric hybrid board of Comparative Example 1 had a breaking strength of 6 N. Thus, it was confirmed that the opto-electric hybrid board of Example 1 had a much higher breaking strength than the opto-electric hybrid board of Comparative Example 1.

While a specific form of the embodiments of the present invention has been shown in the aforementioned inventive example, the inventive example is merely illustrative of the invention but not limitative of the invention. It is contemplated that various modifications apparent to those skilled in the art could be made within the scope of the invention.

The inventive opto-electric hybrid board can be widely used for a variety of electronic devices required to have flexibility, particularly for image display devices and mobile communication devices for consumer use, and for inspection apparatuses for industrial and medical use which are each required to have a smaller size and a higher information processing capability.

REFERENCE SIGNS LIST

1: INSULATION LAYER
2: FIRST ELECTRIC WIRING
6: METAL REINFORCEMENT LAYER
10, 10': OPTICAL ELEMENT
A, A': OPTO-ELECTRIC MODULE PORTION
B: INTERCONNECTION PORTION

The invention claimed is:
1. An opto-electric hybrid board comprising:
an elongated insulation layer;
an opto-electric module portion defined on at least one end portion of the insulation layer;
an interconnection portion defined on a portion of the insulation layer extending from the opto-electric module portion; and
a metal reinforcement layer provided on a back surface of the insulation layer as extending over the opto-electric module portion into a portion of the interconnection portion;
wherein a first electric wiring of an electrically conductive pattern and an optical element are provided on a front side of the opto-electric module portion,
wherein an elongated optical waveguide is provided on a back side of the interconnection portion and optically coupled with the optical element provided on the opto-electric module portion,
wherein a portion of the metal reinforcement layer present in the interconnection portion has a smaller width than a greater width portion of the metal reinforcement layer present in the opto-electric module portion, and a boundary between the smaller width portion and the greater width portion of the metal reinforcement layer is rounded so as to include a rounded proximal corner, and
wherein the metal reinforcement layer present in a portion corresponding to the rounded proximal corner has a width greater than a maximum width of the interconnection portion and has a width smaller than the greater width portion of the metal reinforcement layer.

2. The opto-electric hybrid board according to claim 1, further comprising a second electric wiring provided in the interconnection portion.

3. The opto-electric hybrid board according to claim 1, wherein the rounded proximal corner has a curvature radius R of 0.3 to 5 mm.

4. The opto-electric hybrid board according to claim 1, wherein the metal reinforcement layer is configured such as to extend longitudinally partway of the interconnection portion, and a distal end portion of the metal reinforcement layer in the interconnection portion is rounded so as to include a rounded distal corner.

5. The opto-electric hybrid board according to claim 4, wherein the rounded distal corner has a curvature radius R' of 0.1 to 5 mm.

6. The opto-electric hybrid board according to claim 1, wherein a portion of the metal reinforcement layer extends along the entire length of the interconnection portion.

7. The opto-electric hybrid board according to claim 1, wherein an inner side of the smaller width portion of the metal reinforcement layer present in the interconnection portion has an elongated oval slit extending longitudinally.

8. The opto-electric hybrid board according to claim 1, wherein the smaller width portion of the metal reinforcement layer present in the interconnection portion includes two elongated portions extending longitudinally.

9. The opto-electric hybrid board according to claim 1,
wherein the opto-electric module portion is defined on both end portions of the elongated insulation layer, and
wherein the smaller width portion of the metal reinforcement layer present in the interconnection portion includes two elongated portions extending longitudinally and disconnected in a middle portion of the interconnection portion; and an auxiliary elongated portion extending longitudinally in the middle portion of the interconnection portion.

10. The opto-electric hybrid board according to claim 1,
wherein the opto-electric module portion is defined on both end portions of the elongated insulation layer, and
wherein the smaller width portion of the metal reinforcement layer present in the interconnection portion includes a single elongated portion extending longitudinally and disconnected in a middle portion of the interconnection portion; and two elongated portions extending longitudinally in the middle portion of the interconnection portion so as to interpose the disconnected portion of the single elongated portion.

11. An opto-electric hybrid board comprising:
an elongated insulation layer;
an opto-electric module portion defined on at least one end portion of the insulation layer;
an interconnection portion defined on a portion of the insulation layer extending from the opto-electric module portion; and
a metal reinforcement layer provided on a back surface of the insulation layer as extending over the opto-electric module portion into a portion of the interconnection portion;
wherein a first electric wiring of an electrically conductive pattern and an optical element are provided on a front side of the opto-electric module portion,
wherein an elongated optical waveguide is provided on a back side of the interconnection portion and optically coupled with the optical element provided on the opto-electric module portion,
wherein a portion of the metal reinforcement layer present in the interconnection portion has a smaller width than a greater width portion of the metal reinforcement layer present in the opto-electric module portion, and a boundary between the smaller width portion and the greater width portion of the metal reinforcement layer is rounded so as to include a rounded proximal corner, and
wherein an inner side of the smaller width portion of the metal reinforcement layer present in the interconnection portion has an elongated oval slit extending longitudinally.

12. An opto-electric hybrid board comprising:
an elongated insulation layer;
an opto-electric module portion defined on at least one end portion of the insulation layer;
an interconnection portion defined on a portion of the insulation layer extending from the opto-electric module portion; and
a metal reinforcement layer provided on a back surface of the insulation layer as extending over the opto-electric module portion into a portion of the interconnection portion;
wherein a first electric wiring of an electrically conductive pattern and an optical element are provided on a front side of the opto-electric module portion,
wherein an elongated optical waveguide is provided on a back side of the interconnection portion and optically coupled with the optical element provided on the opto-electric module portion,
wherein a portion of the metal reinforcement layer present in the interconnection portion has a smaller width than a greater width portion of the metal reinforcement layer present in the opto-electric module portion, and a boundary between the smaller width portion and the greater width portion of the metal reinforcement layer is rounded so as to include a rounded proximal corner, and
wherein the smaller width portion of the metal reinforcement layer present in the interconnection portion includes two elongated portions extending longitudinally.

* * * * *